(12) United States Patent
Chou et al.

(10) Patent No.: US 6,249,963 B1
(45) Date of Patent: Jun. 26, 2001

(54) SYSTEM AND METHOD FOR COUPLING CONDUCTIVE PELLETS TO A COMPONENT OF AN INTEGRATED CIRCUIT

(75) Inventors: Jack Chou, Pan Chiao; Johnny Cheng; Joyce Hsu, both of Yung Ho, all of (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/979,125

(22) Filed: Nov. 26, 1997

Related U.S. Application Data

(60) Provisional application No. 60/082,312, filed on Nov. 27, 1996, and provisional application No. 60/033,160, filed on Dec. 13, 1996.

(51) Int. Cl.⁷ .................................................. H01R 9/00
(52) U.S. Cl. .............................................. 29/843; 29/832
(58) Field of Search ............................ 29/843, 876, 877, 29/878, 879, 884

(56) References Cited

U.S. PATENT DOCUMENTS

| | | | |
|---|---|---|---|
| 4,439,306 | * | 3/1984 | Voetter et al. ...................... 208/11 R |
| 4,985,107 | * | 1/1991 | Conroy et al. ........................ 156/289 |
| 5,135,817 | * | 8/1992 | Shimogori et al. .................. 428/621 |
| 5,767,003 | * | 6/1998 | Noguchi ............................... 438/487 |
| 5,824,373 | * | 10/1998 | Biller et al. .......................... 427/474 |
| 5,968,589 | * | 10/1999 | Murakami .............................. 427/96 |

* cited by examiner

*Primary Examiner*—Lee Young
*Assistant Examiner*—Sean Smith
(74) *Attorney, Agent, or Firm*—Gary C. Honeycutt; Fred Telecky; Arthur I. Navarro

(57) ABSTRACT

A system (10) for coupling conductive pellets (40) to a component (12) of an integrated circuit has a substantially planar ribbon (14) that includes a conductive material. A punching apparatus (16) and (38) penetrates the ribbon (14) to form the conductive pellets (40). The punching apparatus (16) and (38) also moves relative to the component (12) to the conductive pellets (40) to the component (12).

6 Claims, 6 Drawing Sheets

SYSTEM AND METHOD FOR COUPLING CONDUCTIVE PELLETS TO A COMPONENT OF AN INTEGRATED CIRCUIT

This application claim benefit to provisional application Ser. No. 60/082,312 Nov. 27, 1996 and claim benefit to provisional application Ser. No. 60/033,160 Dec. 13, 1996.

TECHNICAL FIELD OF THE INVENTION

This invention relates in general to the field of electronic device fabrication, and more particularly to a system and method for coupling conductive pellets to a component of an integrated circuit.

BACKGROUND OF THE INVENTION

Integrated circuit components are electrically coupled to conductive features of electronic devices in which the components operate, for example, a circuit board or other conductive feature. Coupling of components to associated electronic devices often requires the formation of multiple bonds arranged according to the electrical designs of the components and the devices. For example, a ball grid array may have multiple solder or other conductive balls to interconnect the component to the device. The speed at which ball grid arrays can be properly formed and coupled to the associated devices significantly affects the speed, productivity, and overall efficiency of device fabrication.

As the electronics industry continues its intensive pursuit of reduced manufacturing costs and increased speed, precision, and productivity in device fabrication, forming ball grid arrays in an efficient and reliable manner has become increasingly important to replace conventional quad flat pack (QFP) and other packaging technology. In a known technique for forming a ball grid array, individual balls of solder are pre-formed in a separate process, arranged according to the design of an associated component, positioned relative to the component, and then transferred to the surface of the component, which may have been pre-coated with a low temperature solder paste or flux. Such ball attachment techniques are often complex and present difficult size uniformity, quality uniformity, and other quality control problems. For example, such techniques often do not adequately control ball height or cannot form balls of appropriate height for particular applications. Moreover, these techniques do not provide the combination of speed, reliability, flexibility, and productivity that is increasingly required. Furthermore, the deficiencies of such techniques are amplified as pin counts increase and pitches become finer in an effort to increase chip density without sacrificing performance. As a result, previous techniques for coupling components to electronic devices have been inadequate for many applications.

SUMMARY OF THE INVENTION

According to the present invention, the disadvantages and problems associated with coupling integrated circuit components to electronic devices have been substantially reduced or eliminated.

According to one embodiment of the present invention, a system for coupling conductive pellets to a component of an integrated circuit has a substantially planar ribbon that includes a conductive material. A punching apparatus penetrates the ribbon to form the conductive pellets. The punching apparatus also moves relative to the component to couple the conductive pellets to the component.

The system and method of the present invention provide a number of important technical advantages. As pin counts, chip densities, and performance requirements continue to increase in an intensive effort to increase productivity and reduce costs, an important technical advantage of the present invention includes providing a system and method that forms conductive pellets and couples the conductive pellets to a component in a single operation performed at a single location. The punching technique of the present invention increases speed, productivity, and efficiency to reduce manufacturing costs, without sacrificing precision and reliability. Another important technical advantage of the present invention is that the spatial arrangement of the conductive pellets on the component may be precisely specified and modified according to the arrangement of the punches on the punching apparatus, providing flexibility that is lacking in previous techniques.

Another important technical advantage of the present invention is that the ribbon may have any suitable shape and thickness, and may include any conductive material suitable for coupling a component to an electronic device, such that conductive pellets of any type may be formed from the ribbon according to particular needs. Furthermore, the conductive pellets may be coupled to the component whether or not any flux or solder paste has been previously applied to the surface of the component. Moreover, the system and method of the present invention are compatible with current equipment and processing flows. Other important technical advantages are apparent to one skilled in the art from the following figures, description and claims.

The basic process varies slightly depending upon the solder composition. Dependent upon the solder, the solder form may not be completely melted during reflow. A eutectic solder or flux may be placed on the substrate over the contact areas. If the solder plate is eutectic solder then a layer of flux is placed on each contact area to clean the oxidation of the contact areas. Viscosity of the flux is important when a flux is used. High viscosity flux will hold th solder form over a contact area during reflow. A solder flux with a 325-500 mesh size may be used.

After the solder forms are punched out onto the substrate contact areas, the substrate and forms are heated to cause the solder to reflow. The substrate and solder forms are heated in the range of about 150 degrees C. to about 225 degrees C. Time of reflow is between about 3½ minutes and 5½ minutes.

BRIEF DESCRIPTION OF THE DRAWINGS

For a more complete understanding of the present invention and for further features and advantages thereof, reference is now made to the following description taken in conjunction with the accompanying drawings, in which.

DETAILED DESCRIPTION OF THE INVENTION

Figure 1A:
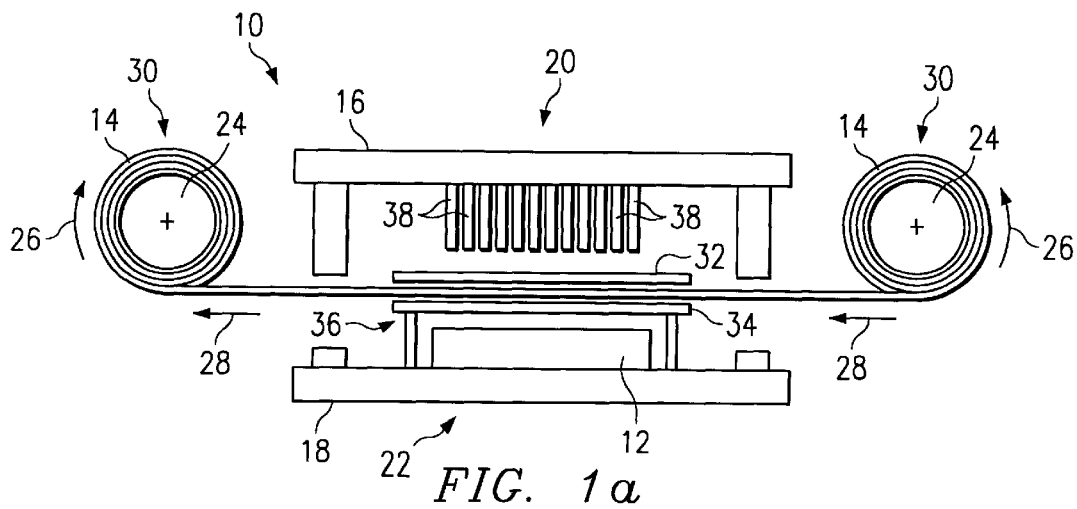
FIGS. 1a and 1b illustrate an exemplary system for coupling conductive pellets to a component of an integrated circuit according to the present invention.

FIG. 1a illustrates an exemplary system 10 for coupling electrically conductive pellets to a component 12 of an integrated circuit. As discussed below, the present invention contemplates pellets in any suitable form, and use of the term pellets should not be understood to limit the scope of the invention to a particular geometric or structural configuration. Component 12 may include one or more chips, dies, leads, or other components suitable for electrical interconnection to a circuit board, another component, or other appropriate feature of an electronic device. According to the present invention, component 12 may be coupled to another conductive feature in a cost-effective, efficient, productive, and reliable manner using conductive pellets formed from ribbon 14.

Ribbon 14 may be formed from any conductive material suitable for forming conductive pellets that are ovate, spherical, cubic, parallelepiped, tetrahedral, or in any other configuration suitable for coupling component 12 to another feature of an electronic device. Ribbon 14 may include, without limitation: aluminum, beryllium copper, brass, bronze, cadmium, copper, gold, lead, nickel, tin-nickel, palladium, platinum, rhodium, silver, eutectic solder, high temperature solder, any other form of solder, indium, tin, an alloy of any of these materials, or any other suitable conductive material, in any combination. The conductive material that forms ribbon 14 may be selected according to the ease with which the material can be soldered or otherwise coupled to eutectic solder or another appropriate material.

In one embodiment, ribbon 14 is a substantially planar strip of conductive material that is wrapped around or otherwise coupled to reels 24 such that rotation of reels 24 in the direction of arrows 26 advances ribbon 14 in the direction or arrows 28. Reels 24 and an appropriate apparatus for controlling and rotating reels 24 form an advancement assembly 30. Reels 24 may be substantially cylindrical or may have any other suitable configuration. Ribbon 14 extends substantially in a single plane, for example, horizontally between reels 24 and is movably positioned between first member 16 and second member 18 of punching apparatus 20 at position 22. Ribbon 14 may also extend between first and second members 32 and 34, respectively, of a stabilizer 36 that maintains the desired position of ribbon 14 at position 22 during operation of system 10. The width of ribbon 14 is determined according to the dimensions and electrical design of component 12. The thickness of ribbon 14 is determined according to the desired height of the conductive pellets that system 10 forms from ribbon 14 and couples to component 12.

Second member 18 may include a strip, tape, or other platform that advances component 12 into and from position 22 according to the operation of system 10, such as a from a position 22 to a second position at which component 12 is coupled to another conductive feature of its associated electrical device. For example, second member 18 or other components of system 10 may advance multiple components 12 in a direction substantially perpendicular to the direction in which ribbon 14 advances, such as into or out of the plane of the page, to allow system 10 to mass produce ball grid arrays according to particular needs. The present invention contemplates other suitable arrangements between ribbon 14, advancement assembly 30, stabilizer 36, and punching apparatus 20.

Figure 1B:
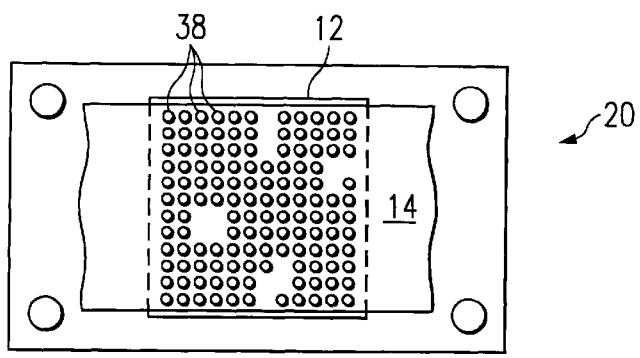

FIG. 1b illustrates punching apparatus 20 and component 12 from above at position 22. Punching apparatus 20 includes multiple punches 38 that extend from punching apparatus 20 toward ribbon 14. Punches 38 may have any construction and configuration suitable for penetrating ribbon 14 to form conductive pellets from ribbon 14, as discussed more fully below with reference to FIGS. 3a through 3e. For example, and not by way of limitation, punches 38 may include one or more blades, edges, points, or other suitable features for penetrating ribbon 14, and may have a cylindrical or other wholly or partially hollow interior. Punches 38 are arranged in accordance with the dimensions and electrical design of component 12, for example, in a wholly or partially compete array such as that illustrated in FIG. 1b. Although punches 38 are shown in a substantially square array, punches 38 may be arranged in any number and in any manner according to the construction of component 12.

In one embodiment, each punch 38 of punching apparatus 20 is positioned relative to a corresponding electrical contact of component 12 that will be coupled to another electrical feature, such as a portion of a circuit board, using a conductive pellet formed from ribbon 14. One or more punches 38 may be selectively arranged according to a numerically control technique, a template, or in any other suitable manner. This selectivity is indicated in FIG. 1b by the incomplete nature of the illustrated array of conductive pellets. The present invention contemplates any arrangement of punches 38 suitable for forming conductive pellets from ribbon 14 and coupling the conductive pellets to component 12 according to the particular configuration of component 12.

Figure 2:
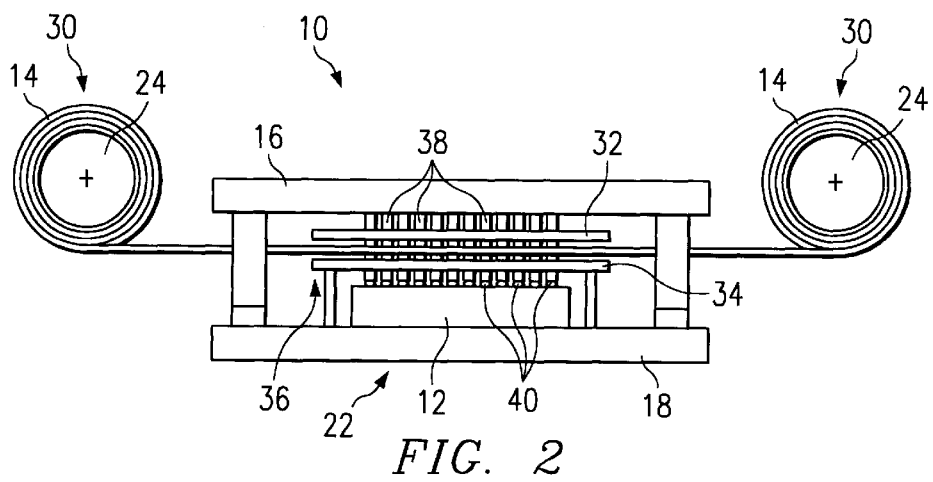
FIG. 2 illustrates an exemplary system for forming conductive pellets and coupling the conductive pellets to a component of an integrated circuit according to the present invention.

FIG. 2 illustrates system 10 forming conductive pellets 40 from ribbon 14 and coupling conductive pellets 40 to component 12 according to the present invention. In one embodiment, as discussed more fully below with reference to FIGS. 3a through 3c, first member 16 of punching apparatus 20 moves toward ribbon 14 and second member 18 of punching apparatus 20 at position 22 to cause punches 38 to penetrate ribbon 14 to form conductive pellets 40. Punches 38 may also pass through one or more openings in first member 32 and second member 34 in addition to penetrating ribbon 14. First member 16 and punches 38 move relative to component 12 to an extent sufficient to cause conductive pellets 40 to contact and couple to component 12 without damaging component 12. In one embodiment, punches 38 apply force more or less continuously to conductive pellets 40 as punches 38 and conductive pellets 40 travel downward, although gravity acting on conductive pellets 40 may assist punching apparatus 20 and punches 38 in coupling conductive pellets 40 to component 12. Conductive pellets 40 may be carried in the interior of punches 38, in whole or in part, as punches 38 move downward to deposit conductive pellets 40 on the surface of component 12. Second member 18 of punching apparatus 20 and advancement assembly 30 may move instead of or in addition to first member 16 of punching apparatus 20 to form conductive pellets 40 from ribbon 14 and to couple conductive pellets 40 to component 12.

In one embodiment, component 12 and conductive pellets 40 coupled to component 12 form a ball grid array of the type increasingly used for integrated circuits. Conductive pellets 40 may adhere to a high viscosity flux or other suitable flux, eutectic solder paste or other suitable solder paste, or any other material previously coupled to the surface of component 12. Conductive pellets 40 may adhere to component 12 due to a flux, solder paste, or other material previously coupled to the lower surface of ribbon 14 instead of or in addition to the surface of component 12. In one embodiment, a flux or solder paste between conductive pellets 40 and component 12 reduces or eliminates undesirable oxides or other materials coupled to component 12 to improve coupling of conductive pellets 40 to component 12. In addition, a flux or solder paste may maintain conductive pellets 40 in position on component 12 before, during, or after reflow or other processing of the ball grid array formed using component 12 and conductive pellets 40 coupled to component 12. The relative positions of conductive pellets 40, component 12, and the electrical features of component 12 may be initially determined and subsequently maintained in any suitable manner.

For example, if ribbon 14 is formed from eutectic solder, a layer of high viscosity flux may be dispensed, printed, or otherwise placed on component 12 according to the arrangement of punches 38 before conductive pellets 40 are deposited on or otherwise coupled to component 12. If ribbon 14 is formed from a high temperature metal, a layer of eutectic solder paste or another suitable adhesive may be dispensed, printed, or placed on component 12 before conductive pellets 40 are coupled to component 12 using a stencil or in another suitable manner. In one embodiment, the stencil used to couple the solder past to component 12 before conductive pellets 40 are coupled to component 12 is approximately six to eight mils thick and has openings that are approximately eighty to ninety percent as wide as the conductive features of component 12 to which the solder paste, and later conductive pellets 40, are coupled. For solder paste, approx 325 to 500 mesh size solder is preferred, although other suitable mesh sizes may be used without departing from the intended scope of the present invention.

Figure 3A:
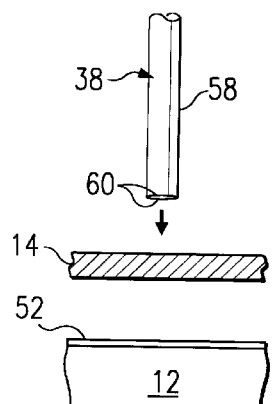
FIGS. 3a through 3e illustrate an exemplary method for generating a conductive pellet and coupling the conductive pellet to a component of an integrated circuit according to the present invention.

FIGS. 3a through 3e illustrate an exemplary method for forming conductive pellets 40 and coupling conductive pellets 40 to component 12 using system 10. As shown in FIG. 3a, ribbon 14 is movably positioned between punch 38 and component 12 at position 22. Punch 38 includes a body 58 having a circular, elliptical, square, or other suitable cross-section. Body 58 terminates in an edge 60 suitable to penetrate the conductive material used to form ribbon 14 to form conductive pellet 40. In one embodiment, edge 60 is sufficiently sharp to precisely form conductive pellet 40, but not so sharp that the useful life of edge 60 and punch 38 is undesirably limited. A high viscosity or other suitable flux 52 is coupled to the surface of component 12, although the present invention contemplates a layer of eutectic solder paste or other suitable adhesive to replace or combine with flux 52, as discussed more fully below with reference to FIGS. 5a and 5b.

Figure 3B:
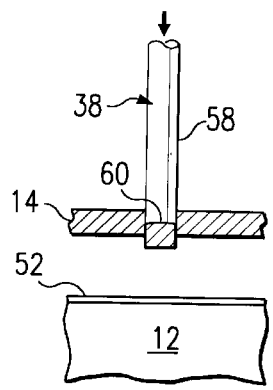
Figure 3C:
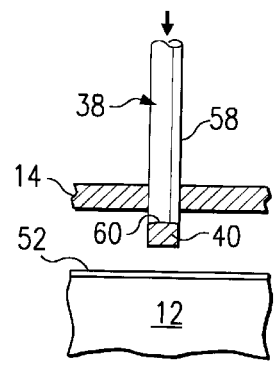

In FIG. 3b, punch 38 has moved downward relative to ribbon 14 and component 12 to allow edge 60 to penetrate ribbon 14. Ribbon 14 may deform slightly as edge 60 and punch 38 move through the interior of ribbon 14 in forming conductive pellet 40. In FIG. 3c, edge 60 of punch 38 has penetrated and passed through the entirety of ribbon 14 to form conductive pellet 40 having substantially the same cross-section as punch 38 and substantially the same height as the thickness of ribbon 14. For example, and not by way of limitation, if punch 38 is circular in cross-section, conductive pellet 40 might have the form of a cylindrical solid. The present invention contemplates any suitable punch 38 forming any suitable conductive pellet 40 from ribbon 14.

Figure 3D:
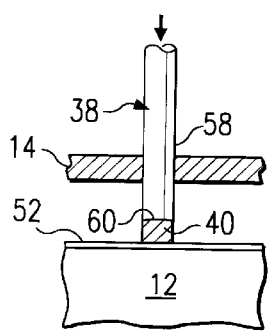

As shown in FIG. 3d, punch 38 moves relative to component 12 to an extent sufficient to cause conductive pellet 40 to contact and couple to component 12 without damaging component 12. In one embodiment, punch 38 applies force more or less continuously to conductive pellet 40 as punch 38 and conductive pellet 40 move toward the surface of component 12, although gravity may assist punch 38 in depositing conductive pellet 40 on the surface of component 12. Conductive pellet 40 may be within body 58 of punch 38, in whole or in part, as punch 38 couples conductive pellet 40 to component 12. In one embodiment, punch 38 applies sufficient force to conductive pellet 40 after conductive pellet 40 has come into contact with flux 52 to cause conductive pellet 40 to adhere to flux 52 in a more or less permanent position relative to component 12. The movements of punch 38 and punching apparatus 20 may be precisely controlled by one or more programmable computers or any other suitable mechanism, allowing system 10 to be customized according to the design of component 12. The present invention contemplates a single punch 38 moving laterally relative to ribbon 14 and component 12 to form multiple conductive pellets 40 for coupling to component 12, possibly in combination with movement of ribbon 14, component 12, or both ribbon 14 and component 12.

Figure 3E:
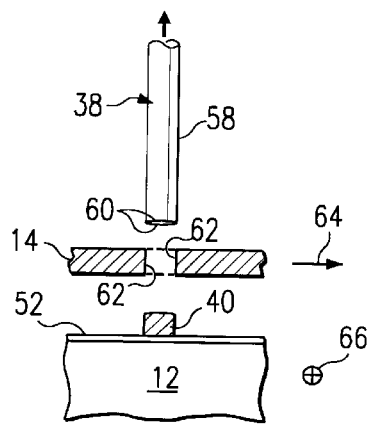

As shown in FIG. 3e, punch 38 moves upward and away from component 12 through channel 62 formed in ribbon 14 after conductive pellet 40 has been coupled to the surface of component 12. Although channel 62 is shown as being relatively smooth and well-defined, the present invention contemplates channel 62 in any configuration. As discussed above, advancement assembly 30 may advance ribbon 14 in the direction of arrow 28 to allow system 10 to form conductive pellets 40 for coupling to another component 12. In coordination with advancement assembly 30, second element 18 or other suitable component of system 10 may advance component 12 from position 22 in a direction substantially perpendicular to arrow 28, as indicated by arrow tail 66. More or less simultaneous to advancement of component 12, system 10 may advance another component 12 into position 22 for coupling of conductive pellets 40. System 10 may have any arrangement suitable for mass production of ball grid arrays that each include conductive pellets 40 coupled to component 12.

Figure 4:
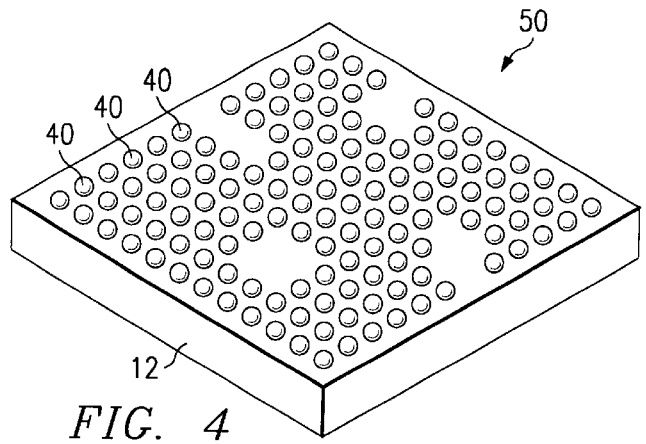
FIG. 4 illustrates an exemplary ball grid array formed using conductive pellets according to the present invention.

FIG. 4 illustrates an exemplary ball grid array 50, after a heating step to reflow the pellets, whereby the shape becomes rounded. Upon cooling, the resulting conductive solder balls are 40 coupled to component 12 according to the present invention. As discussed above, although conductive solder balls 40 may form a substantially square array as shown, the present invention contemplates ball grid array 50 having conductive pellets 40 in any shape and in any suitable arrangement relative to component 12. Ball grid array 50 may be a plastic ball grid array (PBGA) in which at least a portion of component 12 or bond pads on component 12 include a plastic, a ceramic ball grid array (CBGA) in which at least a portion of component 12 or bond pads on component 12 include a ceramic, or any other suitable type of ball grid array.

Figure 5A:
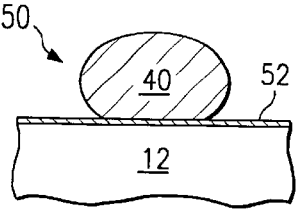
FIGS. 5a and 5b illustrate exemplary conductive pellets coupled to integrated circuit components according to the present invention.
Figure 5B:
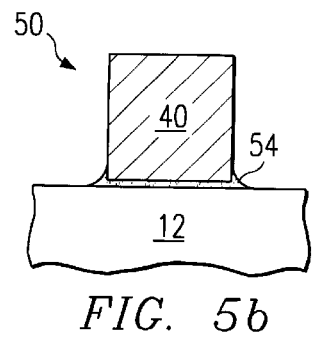

FIGS. 5a and 5b illustrate exemplary conductive pellets 40 coupled to components 12 to form ball grid arrays 50 in accordance with the present invention. In one embodiment, the arrangement of FIG. 5 is for a plastic ball grid array 50 and the arrangement of FIG. 5 is for a ceramic ball grid array 50, although this discussion applies equally to any other suitable ball grid array 50. For plastic ball grid array 50 shown in FIG. 5a, a high viscosity or other suitable flux 52 has been dispensed, printed, or otherwise coupled to the appropriate regions of component 12 before or simultaneous to punching apparatus 20 coupling conductive pellet 40 to component 12. Plastic ball grid array 50 may undergo reflow processing subsequent to the coupling of conductive pellet 40 to component 12, as discussed more fully below with reference to FIG. 6. In one embodiment, the adhesive properties of flux 52 assist punching apt 20 in positioning conductive pellet 40 on component 12 and also in maintaining the position of conductive pellet 40 relative to component 12. Conductive pellet 40 may have a height of approx twenty-five to twenty-eight mils for plastic ball grid array 50, which corresponds to the thickness of ribbon 14, although the present invention contemplates conductive pellet 40 having any height suitable for the application.

For ceramic ball grid array 50 shown in FIG. 5b, a eutectic solder paste or other suitable solder paste 54 has been dispensed, printed, or otherwise coupled to component 12 before or simultaneous to punching apparatus 20 coupling conductive pellet 40 to component 12. In one embodiment, eutectic solder includes approx sixty-three percent tin and approx thirty-seven percent lead. Ceramic ball grid array 50 may be subjected to reflow processing subsequent to the coupling of conductive pellet 40 to component 12. Solder paste 54 assists punching apparatus 20 to position conductive pellet 40 on component 12 and to maintain the position of conductive pellet 40 relative to component 12. In one embodiment, conductive pellet 40 and ribbon 14 used to form conductive pellet 40 are formed from a high temperature metal suitable for ceramic ball grid array 50. Conductive pellet 40 may have a height of approx thirty-five mils for ceramic ball grid array 50, which corresponding to the thickness of ribbon 14, although the present invention contemplates conductive pellet 40 in FIGS. 5a and 5b are merely exemplary, and conductive pellets 40 may have any suitable shape for a plastic, ceramic, or any other ball grid array 50.

Figure 6:
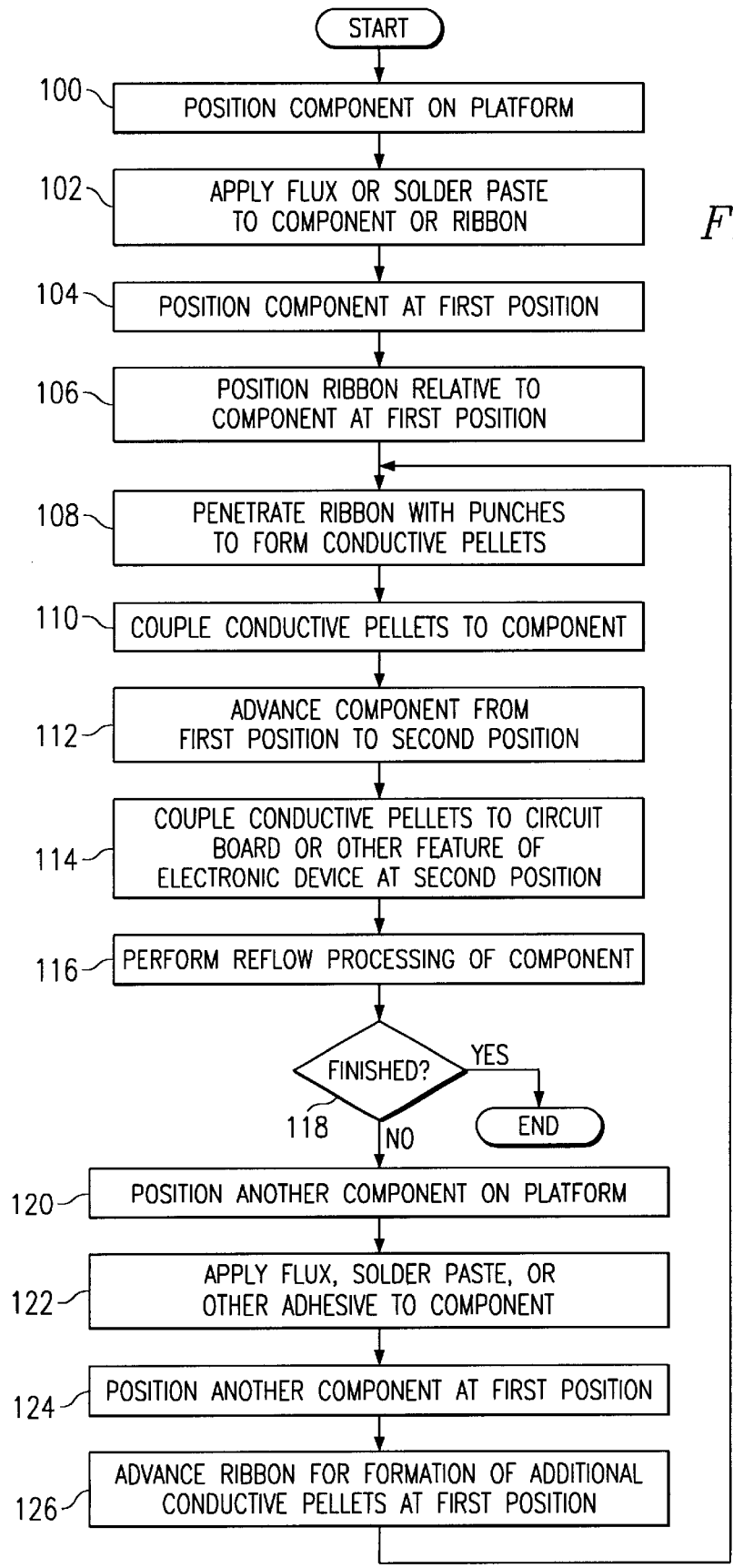
FIG. 6 is a flow chart illustrating an exemplary method of coupling an integrated circuit component to a circuit board using conductive pellets according to the present invention.

FIG. 6 is a flow chart illustrating an exemplary method of coupling component 12 to a circuit board or other electrical feature of an electronic device using conductive pellets 40. The method begins at step 100, where component 12 is positioned on first member 16 of punching apparatus 20 or another platform. At step 102, a high viscosity flux or other flux 52, a eutectic solder paste or other solder paste 54, or another suitable adhesive is applied to the surfaces of component 12, ribbon 14, or both component 12 and ribbon 14. At step 104, the platform associated with first member 16 of punching apparatus 20 advances ribbon 14 into position relative to component 12 at first position 22 at step 106. Component 12 and ribbon 14 may move substantially perpendicular to one another or in any other manner in advancing into first position 22. The present invention contemplates steps 100 through 106 occurring sequentially, simultaneously, or in any other temporal relationship.

At step 108, punching apparatus 20 moves relative to component 12 at first position 22 to penetrate ribbon 14 with punches 38 to form conductive pellets 40. Punching apparatus 20 continues to move relative to component 12 to force, carry, or otherwise transport conductive pellets 40 for coupling to the surface of component 12 at step 110, in cooperation with any flux 52, solder paste 54, or other adhesive previously coupled to component 12. In one embodiment, conductive pellets 40 are carried in the interior of punches 38, in whole or in part, as punching apparatus 20 moves relative to component 12, and are deposited on the surface of component 12 according to the arrangement of punches 38 and the electrical design of component 12 to form ball grid array 50. First member 16 of punching apparatus and ribbon 14 may move instead of or in addition to punches 38. After conductive pellets 40 are coupled to component 12 at step 110 to form ball grid array 50, system 10 advances component 12 from first position 22 to a second position spaced apart from first position 22 at step 112.

Conductive pellets 40 of ball grid array 50 may be coupled to a circuit board or other conductive feature of an electronic device at the second position at step 114 and, at step 116, reflow or other thermal processing of ball grid array 50 may occur at the second position or in any other suitable location. In one embodiment, reflow is performed with a nitrogen gas purged reflow oven. As a result of reflow processing, conductive pellets 40 deform and, after cooling, more or less permanently interconnect component 12 and the feature of the electronic device to which component 12 is coupled. If other components 12 are yet to be processed at step 118, another component 12 is positioned on the platform associated with first member 16 of punching apparatus 20 at step 120, flux 52, solder paste 54, or other adhesive may be applied to component 12 at step 122, and component 12 is positioned at first position 22 at step 124 in the manner discussed above. At step 126, ribbon 14 advances into position relative to component 12 at first position 22 so that additional conductive pellets 40 may be formed and coupled to component 12 in the manner discussed above. The present invention contemplates the formation of multiple sets of conductive pellets 40 for coupling to multiple components 12 in an assembly-line or other suitable fashion. If no other components 12 are yet to be processed at step 118, the method ends.

Figure 7:
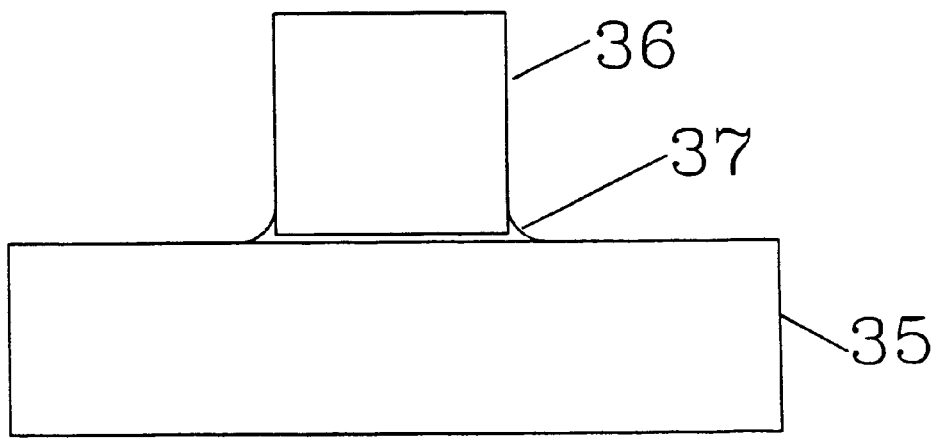
FIG. 7 shows a solder form attached to a substrate.

In FIG. 7, a high temperature punched form is used as the contact. During reflow, only the low eutectic solder has melted soldering the solder form to the contact area. The heating and reflow process may be done in a $N_2$-environment. FIG. 7 shows a substrate 35 with a high temperature solder form 36 attached to the substrate. A low temperature solder 37 attaches solder form 36 to substrate 35.

Figure 8:
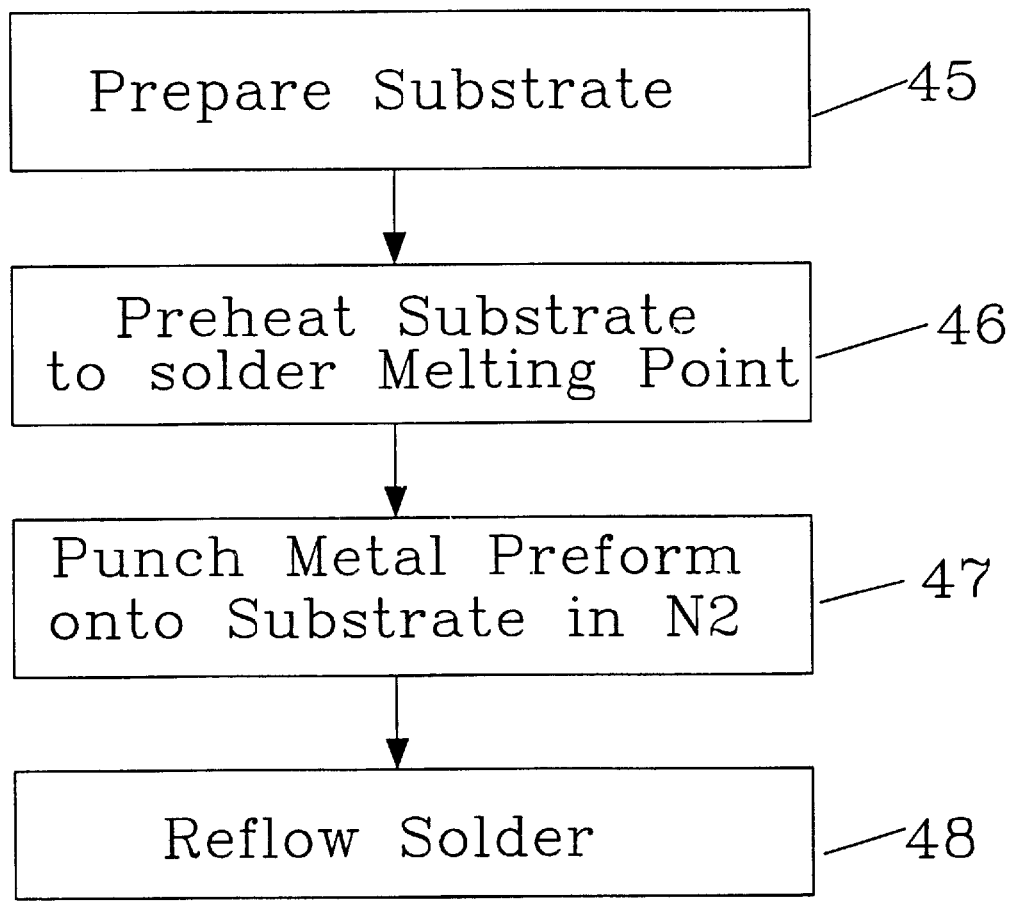
FIG. 8 is a flow diagram of one embodiment of a process for forming and attaching solder contacts.

When forming a solder ball, the process may be as shown in FIG. 8. The substrate is prepared (45), for example by cleaning and a solder flux may be applied to the contact area on which the solder ball is to be formed and attached. The substrate is heated (46) to melt the solder flux. A preform is punched out of a solder sheet (47), for example 63/37 SnPb solder, directly onto the contact area on the substrate within a $N_2$ environment. The solder reflows and forms the solder ball (48).

Figure 9:
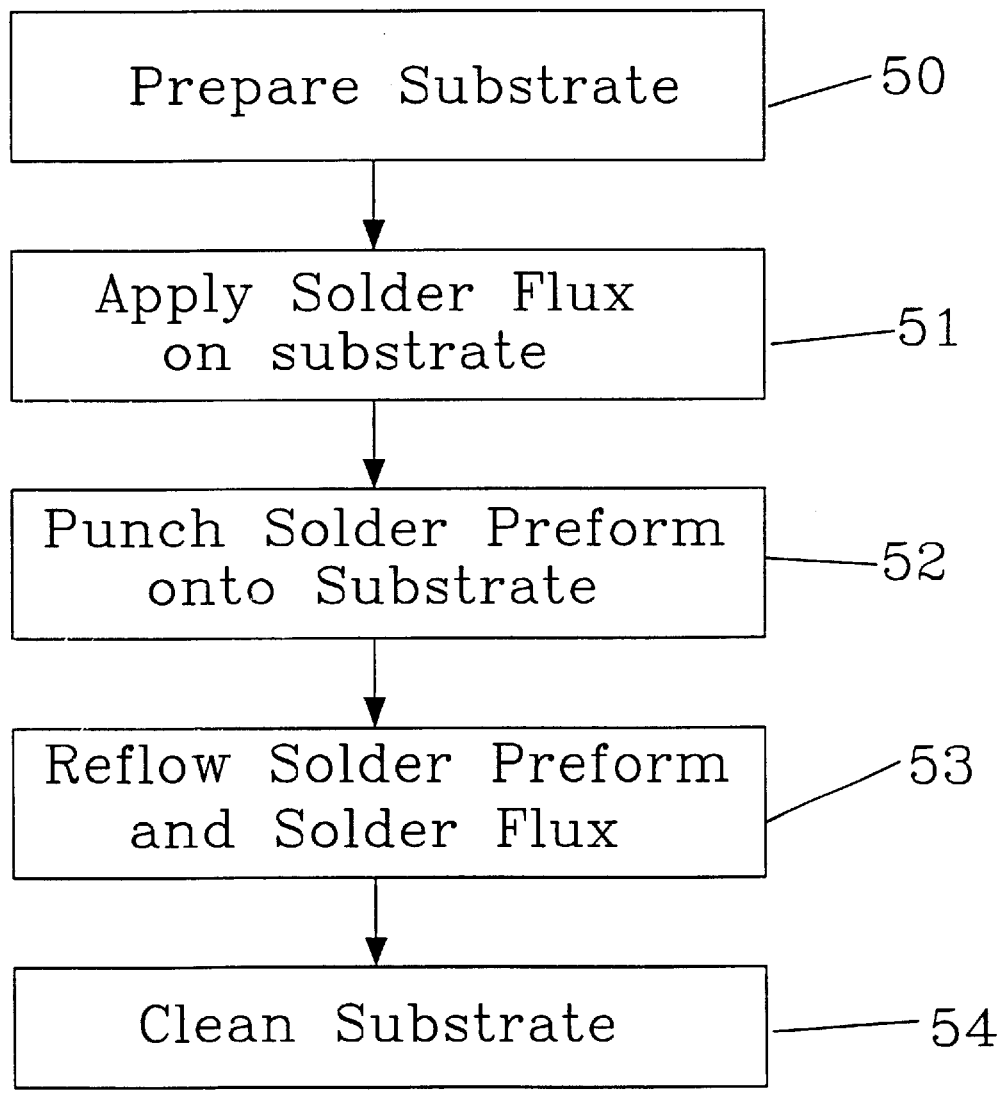
FIG. 9 is a flow diagram of a second embodiment of a process to make and place the solder balls on the substrate.

A second embodiment of the process is shown in FIG. 9. The substrate is prepared (50) and a solder flux or paste is applied to the substrate (51) over the contact areas. A preform is punched out of the solder sheet (52), for example 90/10 SnPb or 63/37 solder composition, directly onto the substrate. The substrate is heated to cause the solder to reflow (53) forming the solder contact. The substrate is then cleaned (54).

Although the present invention has been described above in connection with several embodiments, it should be understood that a plethora of changes, substitutions, variations, alterations, transformations, and modifications may be suggested to one skilled in the art, and it is intended that the present invention encompass such changes, variations, substitutions, alterations, transformations, and modifications as fall within the spirit and scope of the appended claims.

What is claimed is:

1. A method for forming solder contact on contacts areas of ball grid array semiconductor devices, comprising the steps of:

pre heating a semiconductor substrate;

applying an adhesive solder paste to a sheet of solder material;

punching from said sheet of solder material directly onto contact areas on a semiconductor substrate a plurality of solder forms; such that said paste holds the solder forms in place; and then reflowing the solder forms by the application of heat to form solder contacts on the semiconductor substrate.

2. The method according to claim 1, wherein the reflow of the solder is done in a $N_2$ atmosphere.

3. The method according to claim 1, wherein a solder flux is applied to the contact areas prior to punching the solder forms onto the substrate.

4. The method according to claim 1, wherein the substrate is preheated to a temperature in the range of 150 to 225 degrees C.

5. The method according to claim 1, wherein the solder sheet is of solder selected from 63/37 SnPb or 90/10 Sn/Pb solder composition.

6. The method according to claim 1, wherein the substrate and solder forms are subjected to a reflow for a period of 3½ minutes to 5½ minutes.

* * * * *